(12) United States Patent  (10) Patent No.: US 6,666,691 B2
Ikeya  (45) Date of Patent: Dec. 23, 2003

(54) SOCKET FOR REMOVABLY MOUNTING ELECTRONIC PACKAGES

(75) Inventor: Kiyokazu Ikeya, Shizuoka (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/234,613

(22) Filed: Sep. 4, 2002

(65) Prior Publication Data
US 2003/0054675 A1 Mar. 20, 2003

(30) Foreign Application Priority Data
Sep. 14, 2001 (JP) ........................................ 2001-279222

(51) Int. Cl.$^7$ .............................................. H01R 13/62
(52) U.S. Cl. .......................... 439/71; 439/331; 439/268
(58) Field of Search ............................. 439/71, 73, 330, 439/331, 66, 266, 70, 268, 259, 263, 264, 265; 324/755, 754

(56) References Cited

U.S. PATENT DOCUMENTS

| 5,376,010 | A | * | 12/1994 | Petersen | 439/71 |
|---|---|---|---|---|---|
| 5,690,281 | A | * | 11/1997 | Ikeya | 439/268 |
| 5,788,513 | A | * | 8/1998 | Kajiwara et al. | 439/72 |
| RE36,217 | E | * | 6/1999 | Petersen | 324/755 |
| 6,027,355 | A | * | 2/2000 | Ikeya | 439/268 |
| 6,050,836 | A | * | 4/2000 | Tohyama | 439/266 |
| 6,123,552 | A | * | 9/2000 | Sakata et al. | 439/71 |
| 6,280,219 | B1 | * | 8/2001 | Sano et al. | 439/266 |
| 6,322,384 | B1 | * | 11/2001 | Ikeya | 439/331 |
| 6,439,910 | B2 | * | 8/2002 | Hayakava | 439/266 |
| 6,575,767 | B2 | * | 6/2003 | Satoh et al. | 439/71 |

* cited by examiner

Primary Examiner—Alexander Gilman
(74) Attorney, Agent, or Firm—Russell E. Baumann; Frederick J. Telecky, Jr.

(57) ABSTRACT

A socket (1) has a base (2) on which rows of contact pins 4 are arranged, the contact pins being elastically deformable in the vertical direction, an adaptor (5) having rows of contact holes (5d) arranged extending through a seating surface (5c) and which is capable of vertical movement relative to the base (2) so that contact tips (4a) of contact pins (4) can move in respective contact holes (5d). Latches (21) are arranged to be able to press the IC package on the seating surface (5c) of the adaptor (5) and a vertically movable regulator (7) is arranged at a selected position relative to adaptor (5) when stop surfaces (7e) of the regulator are engaged with a part (4e) of the contact pins (4) so as to regulate the position of the contact tips (4a) in the contact holes (5d).

12 Claims, 10 Drawing Sheets

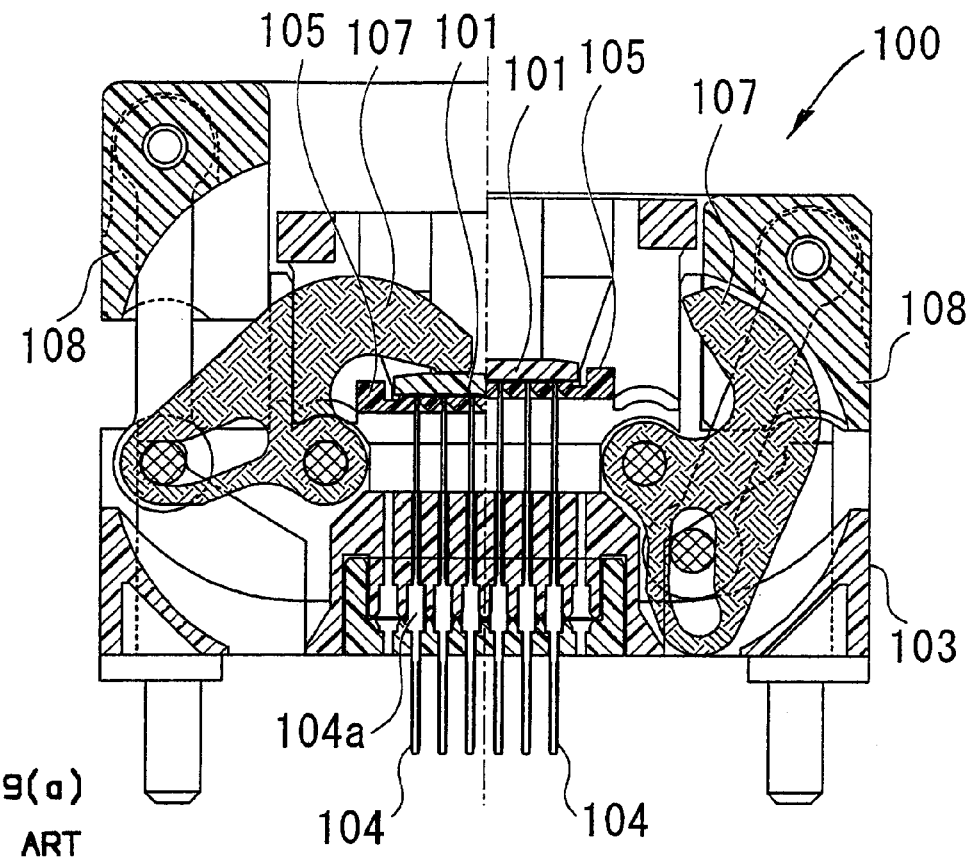
FIG. 9(a)
PRIOR ART
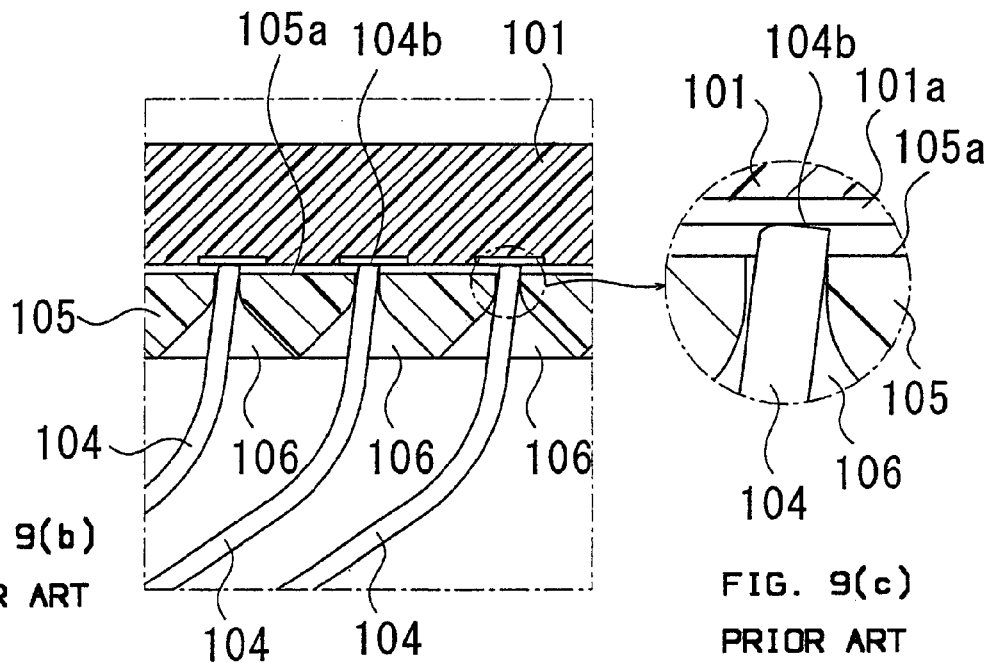
FIG. 9(b)
PRIOR ART
FIG. 9(c)
PRIOR ART

SOCKET FOR REMOVABLY MOUNTING ELECTRONIC PACKAGES

FIELD OF THE INVENTION

This invention relates to sockets used for effecting an electric connection between an electronic package and an external device and more particularly to the arrangement of contact elements in such sockets that engage the terminals of the electronic package.

BACKGROUND OF THE INVENTION

Generally, an IC package is manufactured by sealing an IC chip having an electronic circuit on its main surface with plastic and prior to shipment, the IC packages are subjected to a reliability test called a burn-in test in order to separate acceptable units from unacceptable ones. In conducting this burn-in test, a socket is used for the purpose of effecting an electric connection between the IC package and a substrate used for testing.

As shown in FIGS. 9(a) and 9(b), a plurality of contact pins 104 are arranged on a base 103 of a conventional socket 100 to correspond to the terminal arrangement of an IC package 101 placed in the socket. Each contact pin 104 comprises an anchor portion 104a secured to the bottom of the center of base 103 and a contact part 104b which is elastically biased against a respective terminal of IC package 101. An adaptor 105 is mounted on base 103 for vertical movement relative thereto and is used for seating IC package 101. A plurality of contact holes 106 are formed in adaptor 105 which are somewhat larger than the outer shape of the contact part 104b of contact pin 104. The adaptor 105 accommodates the tip part of a respective contact pin 104 in a contact hole 106.

A latch 107 is provided on base 103 for pressing IC package 101 to open or close in linkage with a vertically movable cover 108. IC package 101 is pushed down along with adaptor 105 as latch 107 applies a force to IC package 101, thereby causing contact pins 104 that have protruded from the contact holes 106 above the seating surface 105a to contact terminals 101a of IC package 101.

This type of conventional socket 100 has certain limitations and problems as will be described below:

Since there are some variation in the size of each contact hole 106 of adaptor 105 and the length of each contact pin, the location of the tip of contact pin 104 and the edge part of the contact hole 106 varies, depending upon the contact pins. Even if the contact pins 104 were to be pressed to the same position at the edge portion of contact holes 106 by bending each contact pin 104 through a lowering of the engagement position of the adaptor, for example, the amount of the protrusion of the contact part 104b of contact pins 104 will vary from the seating surface 105a of adaptor 105.

As a consequence, even if the engagement position of adaptor 105 were to be adjusted so that the contact part 104b of contact pins 104 would not protrude from the seating surface 105a of adaptor 105, as shown in FIG. 10, some contact pins 104 inevitably protrude from seating surface 105a of adaptor 105 due to the variation of the length of the contact pins and the like. When IC package 101 is placed on adaptor 105, therefore, the IC package tends to catch on contact pins 104 that have protruded, thereby interfering with mounting of the IC package.

SUMMARY OF THE INVENTION

An object of the present invention is the provision of a socket which overcomes the above described limitations and problems associated with the conventional technology. Another object of the invention is the provision of a socket which is capable of smoothly mounting electronic packages, without the electronic package being caught by the tip part of the contact pins on the seating surface.

Briefly, according to a preferred embodiment of the invention, a socket comprises a base, a cover mounted on the base for alternating motion in the vertical direction relative to the base, first spring members that urge the cover in the upward direction away from the base, a plurality of elongated contact elements each having a first end secured to the base, an intermediate curved part extending from the first end and which can be elastically deformed, a contact part having a second end or contact tip linked to the curved part and which can be elastically pressed against a respective connective terminal of an electronic part, and a protrusion formed at a location which is separated from the second end of the contact element by a selected length. The socket includes a regulator having a plurality of through holes through which the contact part of the contact elements extend in such a way that the regulator is able to engage in an alternating motion in the vertical direction relative to the base, a plurality of control parts for the regulation of the displacement of the contact parts as the control parts engage the protrusion of the contact elements, and a latch member which is provided on the base in such a way as to pivot, making it possible for an electronic package to be inserted by pivoting the latch member from an original closed position to a removed open position in linkage with the downward motion of the cover, and which presses the electronic package that has been mounted in a downward direction by pivoting from the open position to the original closed position in linkage with the return movement of the cover body.

An adaptor is formed with a seating surface for seating the electronic package and second spring members urge the adaptor in an upward direction away from the base. The regulator is also biased in an upward direction away from the base. When the adaptor and the regulator are at their respectively highest locations, a selected distance is provided between the adaptor and the regulator. An electronic package mounted on the seating surface when the latch is in its open position, is pressed against the connective terminals of the electronic package as the latch pivots to its original closed position.

According to a feature of the invention, the tip of the contact parts are disposed below the seating surface when the adaptor is at its highest position. Further, the tip of the contact parts are adapted to be in engagement with the connective terminals of the electronic package on the seating surface when the latch is at its original closed position.

According to a feature of the invention, third spring means in the form of the contact elements themselves bias the regulator in an upward direction relative to the main base.

Additional objects and features of the invention will be set forth in part in the description which follows and in part will be obvious from the description. These objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of the specification, illustrate a preferred embodiment of the invention and together with the description, serve to explain the objects, advantages and principles of the invention.

In the drawings:

FIG. 9(a) is a cross sectional view of the front of a conventional socket showing the cover in the left half of the view at its upper most position and showing the cover in the right half of the view at its lower position;

FIG. 9(b) is an enlarged sectional view of a portion of FIG. 9(a) showing an end portion of contact pins;

FIG. 9(c) is a further enlarged view of fragment B of FIG. 9(b);

DETAILED DESCRIPTION OF THE PREFERRED EMBODIMENT

Figure 1:
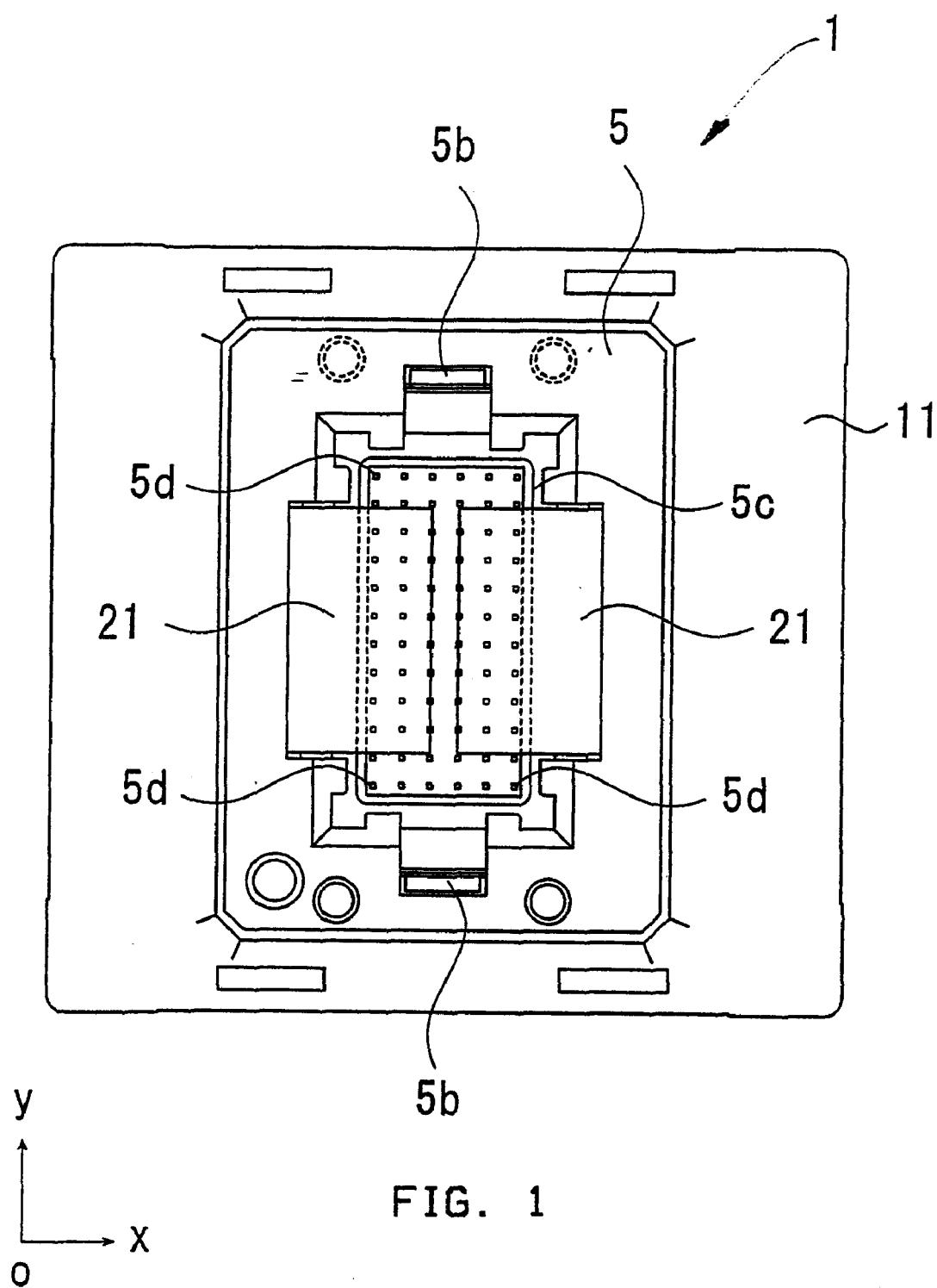
FIGS. 1–3 are somewhat simplified top plan, front elevational and right side elevational views, respectively, of a socket made in accordance with the preferred embodiment of the invention.
Figure 2:
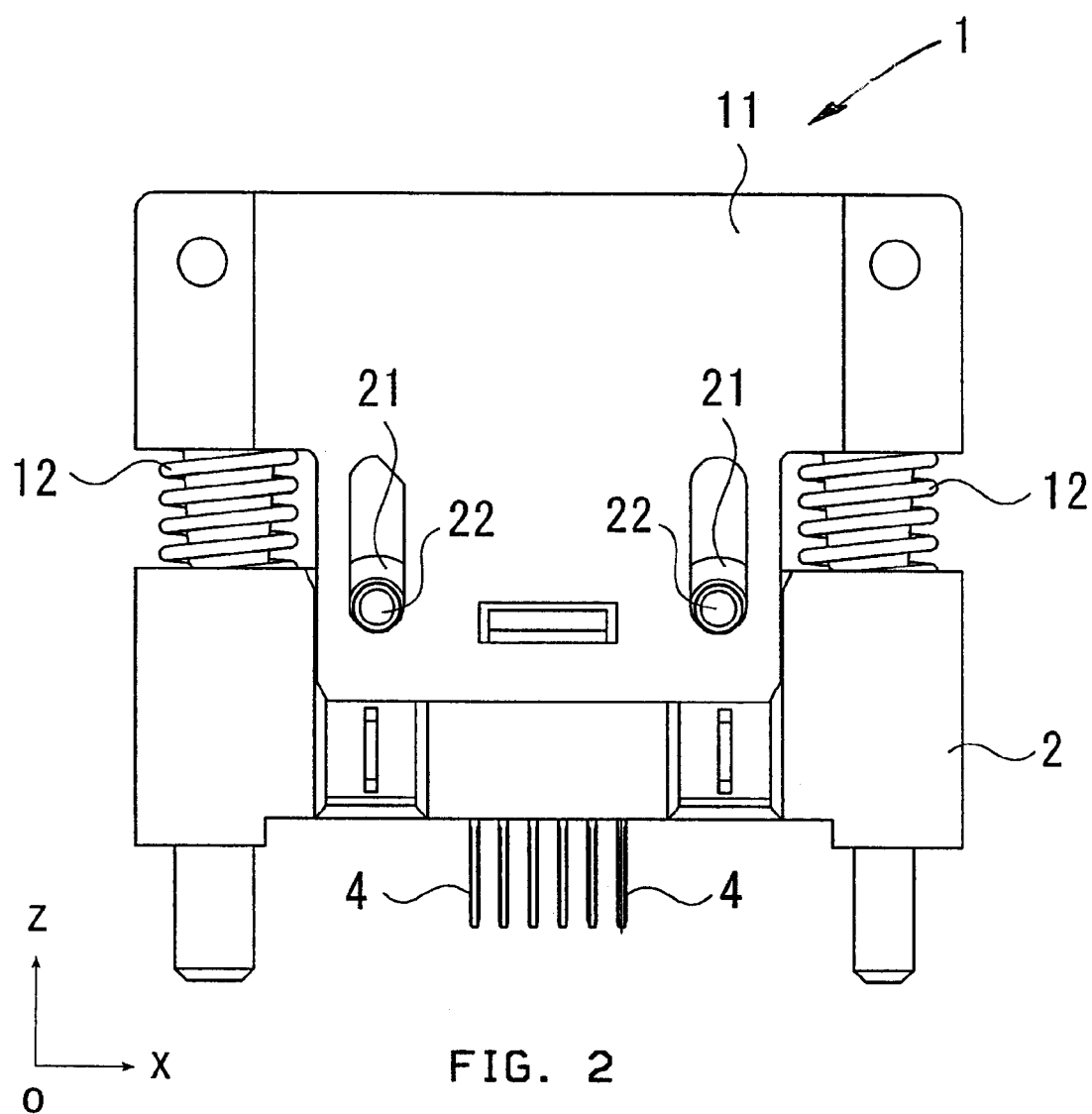
Figure 3:
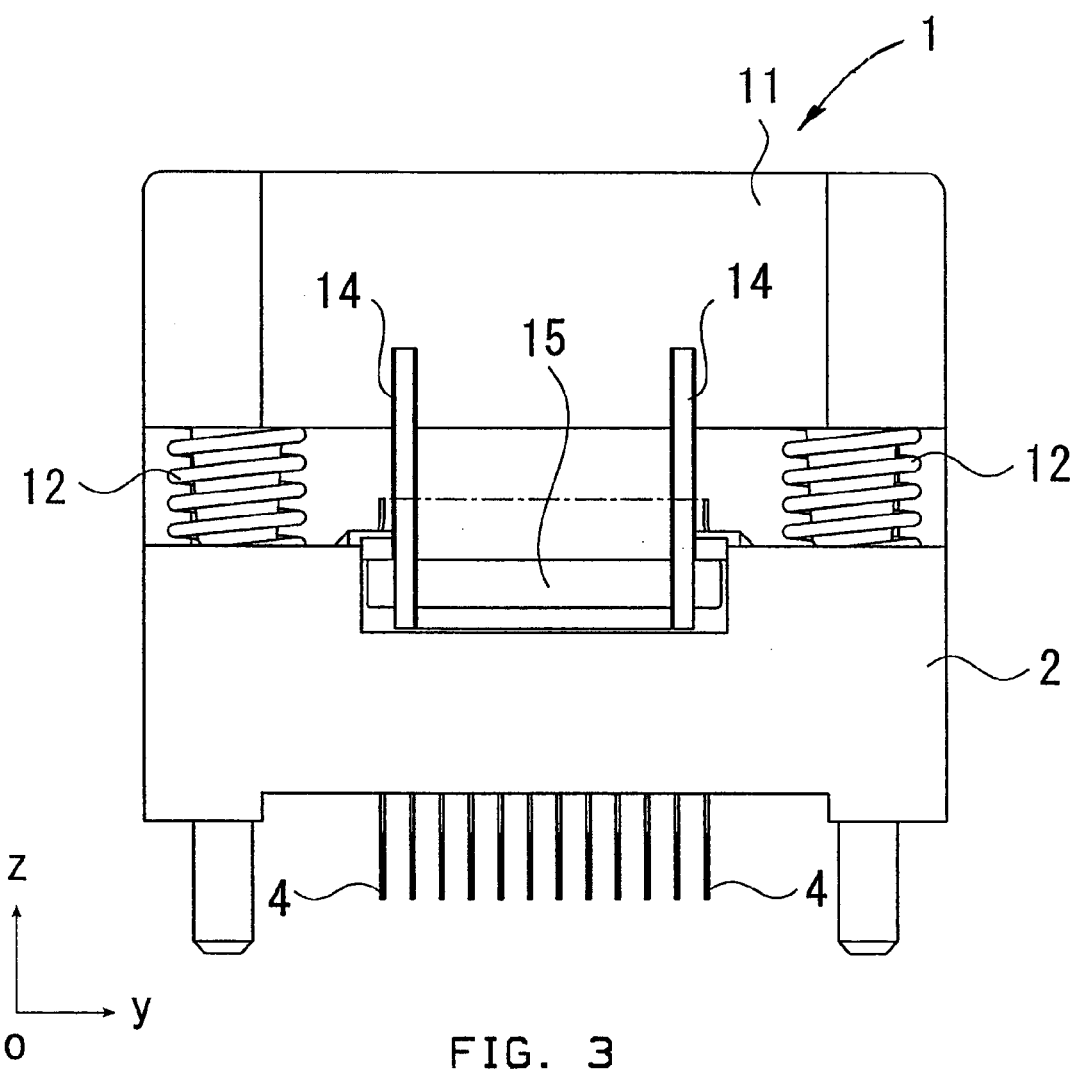

Turning to the drawings, socket 1 made in accordance with the preferred embodiment of the invention, as shown in FIGS. 1–3, is adapted for mounting an electronic package such as an IC package of the LGA (Land Grid Array) type having flat terminals arranged in a selected matrix of a selected pitch on the bottom of the package. Package 1 has a base 2 that has been formed generally as a rectangular parallelepiped having an oblong cross section of a selected length. An xyz coordinate system is shown below the figure using base 2 as a standard and will be used in the following description.

Figure 4:
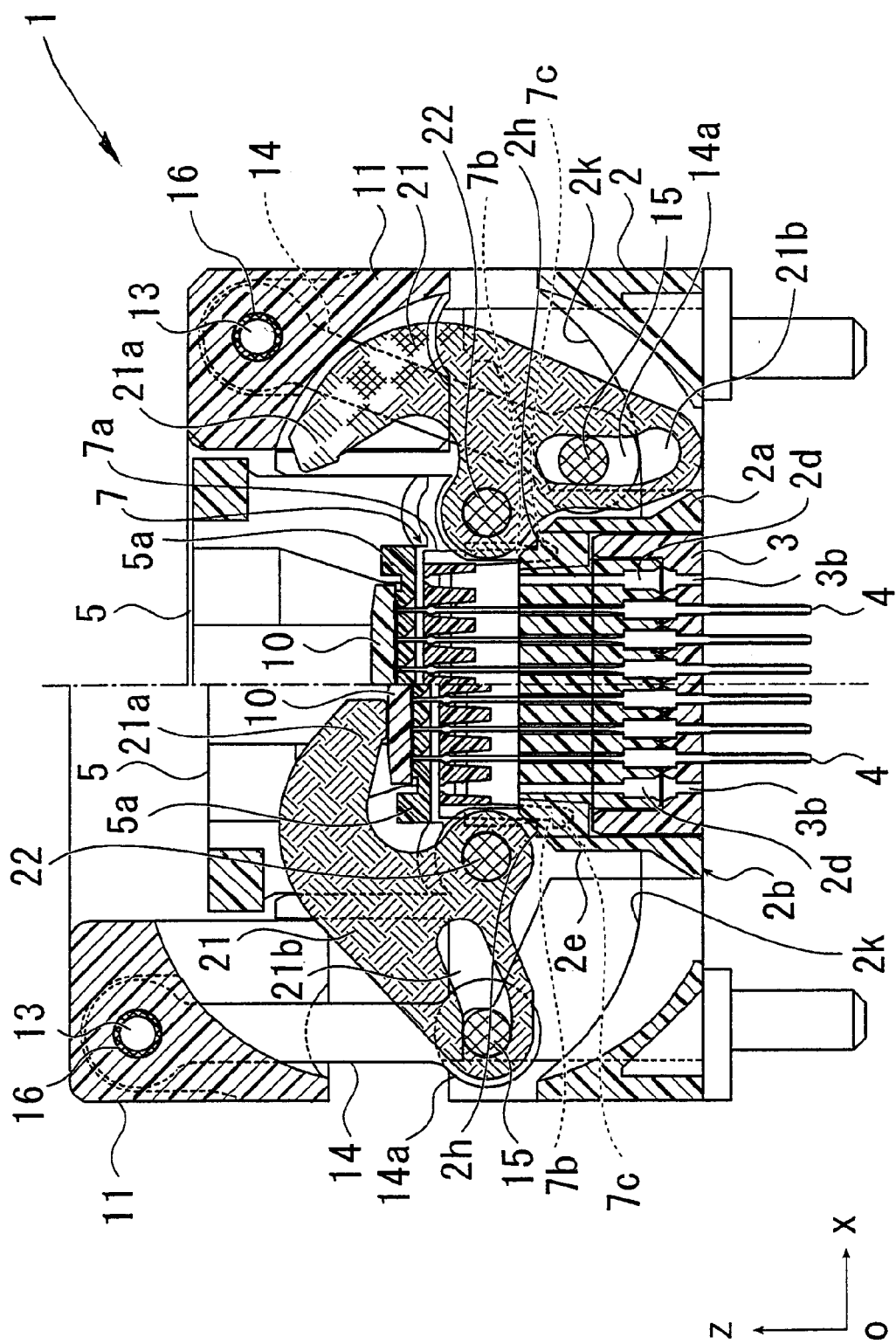
FIG. 4 is a cross section elevational view at the front of the socket with the left half of the figure showing the cover at its upper or top position and with the right half showing the cover at its lower position.
Figure 5:
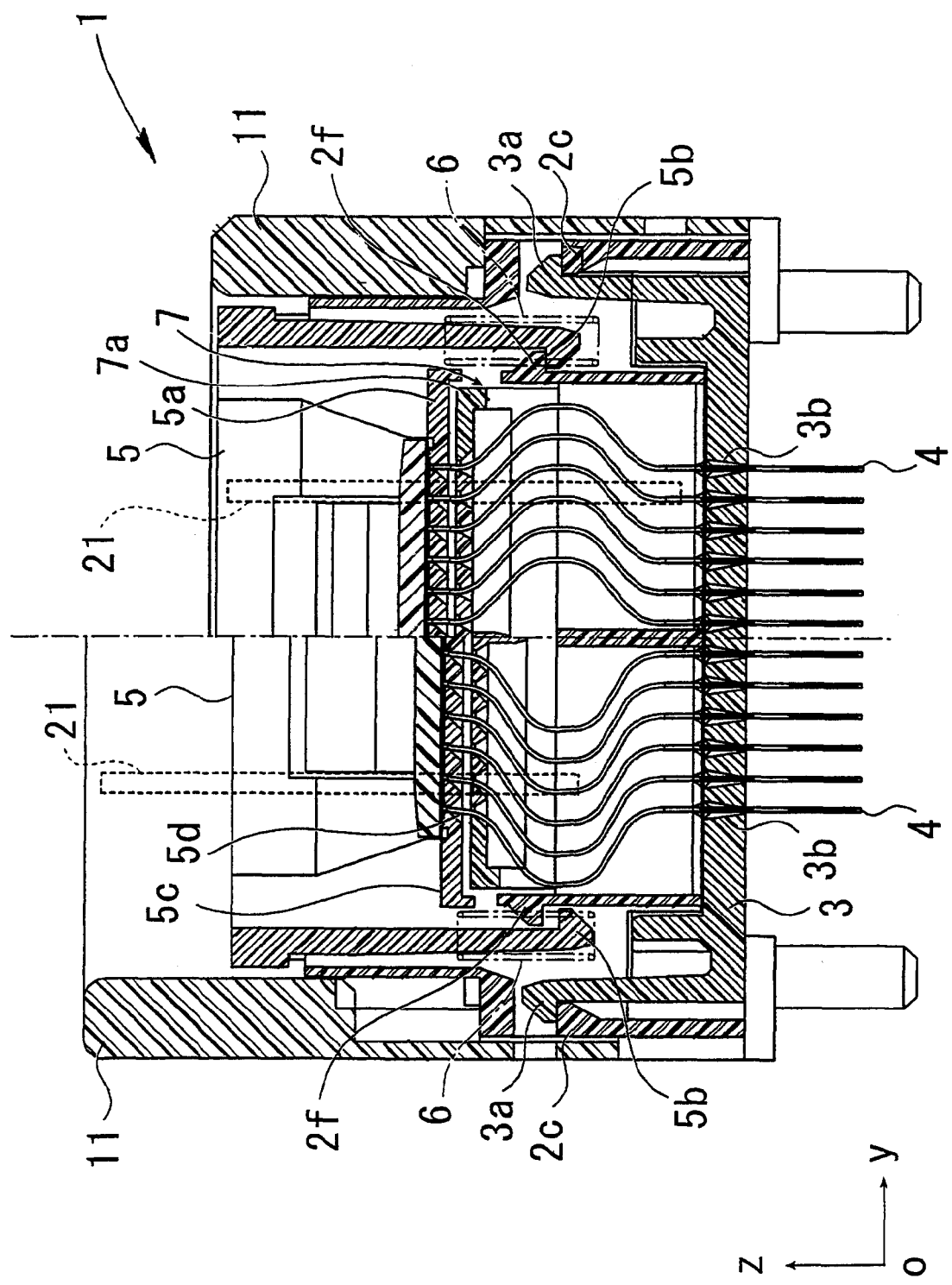
FIG. 5 is a cross section elevational view taken through the right side of the socket with the left half of the figure showing the cover at its top position and with the right half of the figure showing the cover at its lower position.

On the bottom part 2a at the center of base 2, a contact element stopper 3 is detachably provided for the purpose of fixing a plurality of contact elements or pins as shown in FIGS. 4 or 5. Stopper 3 has a rectangular cross section which is smaller than bottom 2b of base 2 and is configured approximately as a rectangular parallelepiped to engage with bottom 2a of the base from below. An engagement hook 3a extends in an upward direction (z+direction) from both ends of the stopper and, as the engagement hooks 3a are engaged with respective engaging parts 2c provided on base 2, stopper 3 is fixed forming an integral member with base 2.

Figures 6A, 6B:
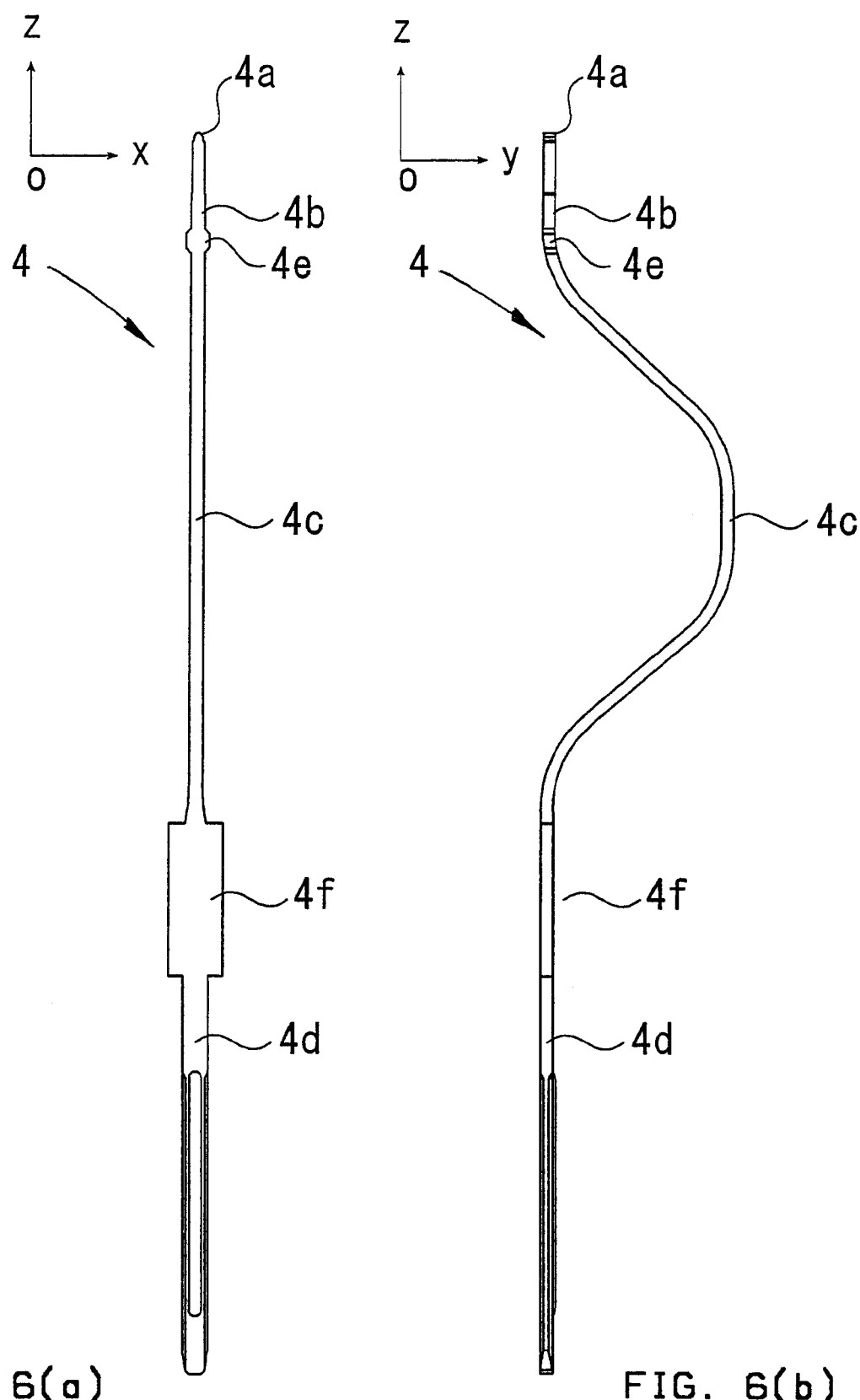
FIG. 6(a) is a front elevational view showing a simplified view of the contact element or pin used in the socket.
FIG. 6(b) is a right side elevational view showing a simplified view of the FIG. 6(a) contact pin.

Contact pins or elements 4 used in the preferred embodiment are made from an oblong metal piece. As shown in FIG. 6(a), the shape at the front (xz plane) of base 2 of each pin is formed so that contact part 4b has a contact tip 4a in the shape of a spearhead at the upper end, an elastic portion 4c and a lead portion 4d extending along a straight line. With reference to FIG. 6(b), however, the shape with reference to the right side of base 2 (yz plane) is such that the elastic portion 4c is formed in a curve having a convex configuration in the Y+direction between the contact part 4b and the lead portion 4d which extends along the same straight line.

Figure 7A:
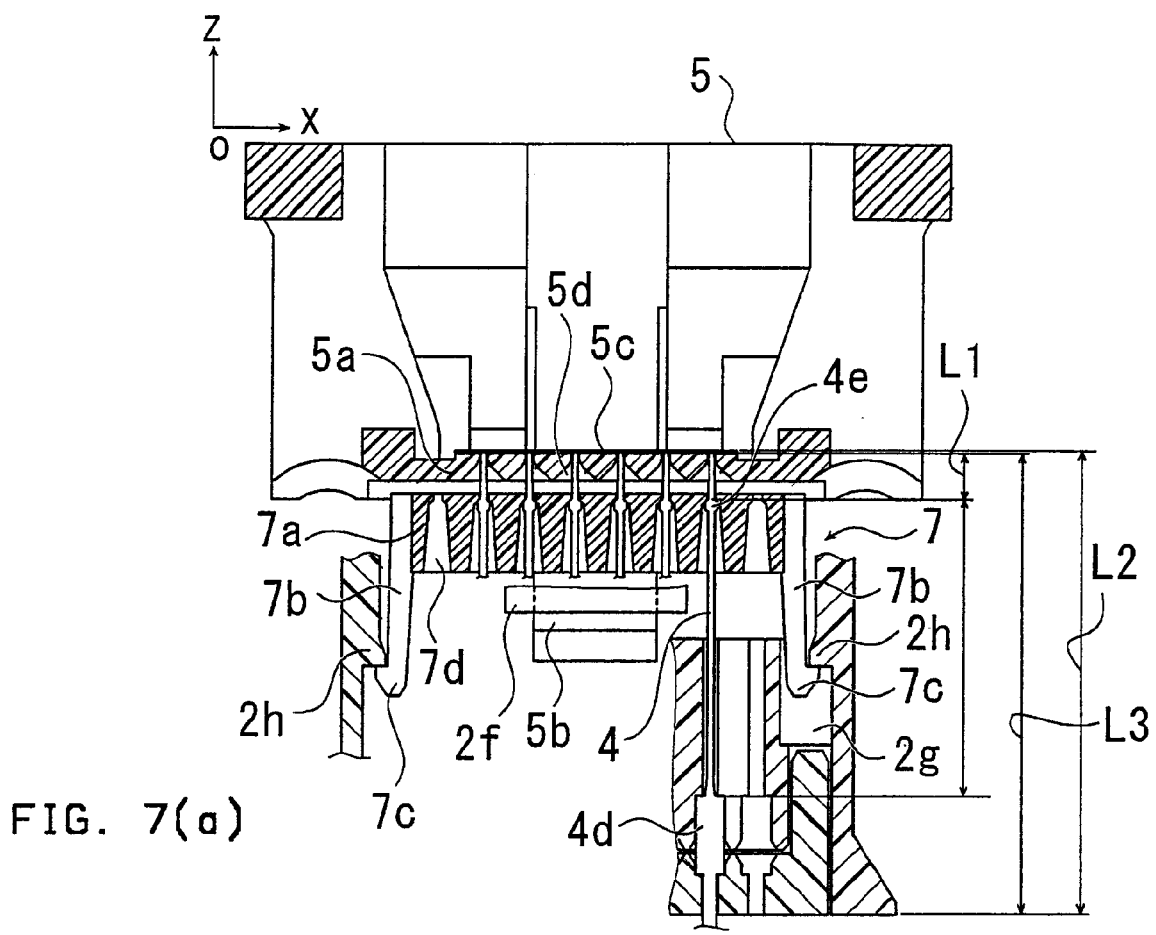
FIG. 7(a) is a cross sectional view at the front of the socket indicating the positional relationship between the adaptor and the regulator in the embodiment described.
Figure 7B:
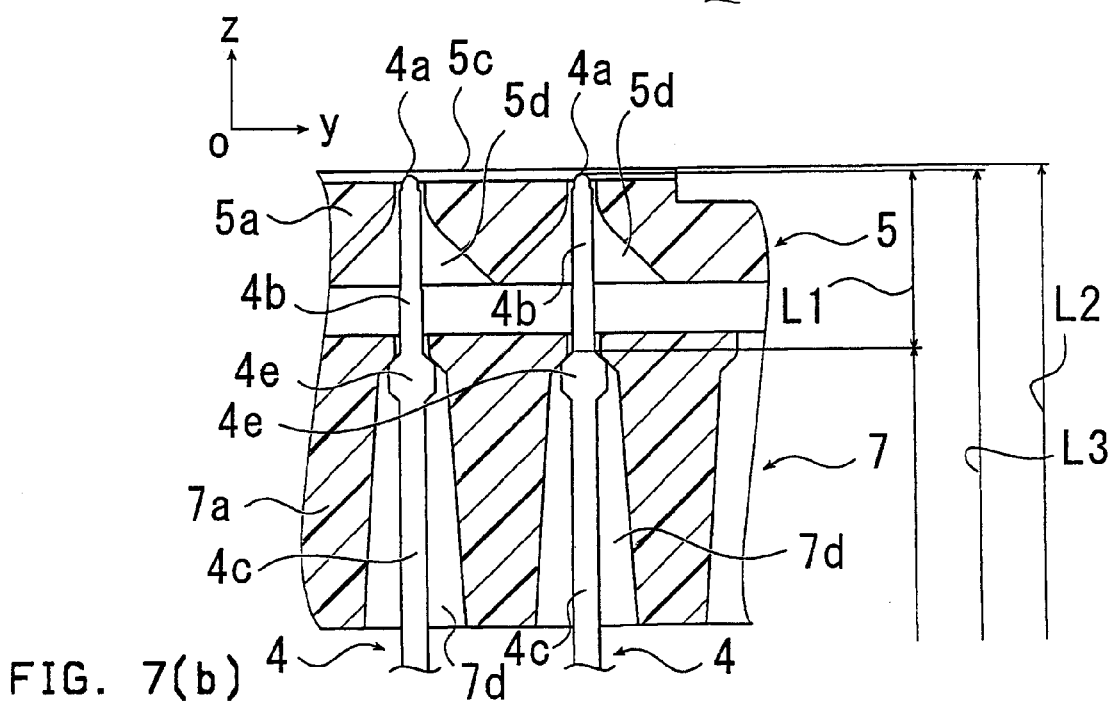
FIG. 7(b) is an enlarged cross sectional view of a portion of FIG. 7(a) showing contact pins and a broken away portion of the regulator as well as the adaptor.

A first protrusion 4e is formed on the boundary between the contact part 4b and the elastic portion 4c and a second protrusion 4f is formed on the boundary between the elastic portion 4c and the lead portion 4d. The first and second protrusions 4e and 4f generally lie in a plane so as to form linear symmetry relative to the center line in the x direction of contact pins 4. With reference to FIGS. 7(a) and 7(b), the length between first protrusion 4e and contact tip 4a is controlled to be within the dimensionally permissible range based on a selected common tolerance of the regulation length L1.

As shown in FIGS. 4 or 5, a plurality of stopper holes 3b, for stopping contact pins 4 via second protrusion 4f when the lead portion 4d of contact pins 4 have been caused to extend through to the lower side, are provided on stopper 3 in conformity with the terminal arrangement of the IC package 10. Slots 2d, in the bottom 2a of base 2, accommodate the elastic portion 4c of contact pins 4 and are provided in conformity with stopper holes 3b of stopper 3. Contact pins 4 are arranged in an erect state relative to the bottom 2b of base 2 with the second protrusions 4f fixed by being sandwiched between slot 2d of base 2 and the stopper hole 3b of stopper 3.

Adaptor 5 for seating IC package 10 is mounted for vertical movement with compression coil springs 6 interposed between the base and the adaptor. Adaptor 5 has an opening sized to permit insertion of IC package 10 and a seating portion 5a for positioning IC package 10. Engagement hooks 5b extending in a downward direction (z–direction) from both ends are engageable with first engagement parts or stops 2f provided on base 2. Adaptor 5 is biased in an upward direction away from the base by means of compression coil springs 6. A plurality of contact holes are formed through seating portion 5a of adaptor 5 in conformity with the arrangement of the contact pins 4 for allowing contact tip 4a of each contact pin 4 to protrude from seating surface 5c. As shown in FIGS. 7(a) and 7(b), contact holes 5d approximately in the shape of a quadrangular pyramid are formed through seating portion 5a in the z direction and the square cross section becomes gradually smaller from the lower surface toward the upper surface of seating portion 5a and, on seating surface 5c, contact holes 5d are in the shape of a square which is somewhat larger than the outer configuration of contact part 4b.

Upward movement of adaptor 5 is limited at a first stopping position determined by the engagement of hooks 5b of the adaptor with stops 2f of the base with the adaptor 5 at its highest position relative to base 2. The arrangement of the contact pins and the adaptor is such that the contact tips 4a of contact pins 4 do not protrude from the seating surface 5c. According to the preferred embodiment, a regulator 7 that regulates the position of contact pins 4 is movably mounted between center 2e of base 2 and adaptor 5 for moving up and down relative to base 2 as shown in FIG. 4, 5 or 7(a). Regulator 7 has a generally rectangular plate 7a approximately the same shape as the seating portion 5a of adaptor 5 and has leg parts 7b at its four corners that extend in a downward direction (z–direction). Engagement hooks 7c are formed at the tip of each leg part 7b extending a like distance. A hole 2g is provided at each corner of the central portion 2e of the base for reception of a respective leg part 7b of regulator 7. Second stops 2h are formed inside holes 2g at the same height on the central portion 2e of the base for engagement with engaging hooks 7c of regulator 7. Regulator 7 is biased upwardly by the spring force of elastic portion 4c of contact pins 4 and hooks 7c engaging second stops 2h of base 2 define the second stopping position at the highest position of regulator 7 relative to base 2.

A plurality of regulation holes 7d are formed through plate portion 7a of regulator 7 for regulating the height of contact tips 4a. Holes 7d are provided in conformity with the arrangement of the contact holes 5d of adaptor 5 and limit movement of the contact parts 4b by stopping the first protrusion 4e of the contact pins to prevent the contact parts from protruding above the seating surface 5c. Each regulating hole 7d is formed approximately in the shape of a cone that runs through the plate portion 7a in the z direction. Its cross section is such that it becomes gradually smaller from the lower surface toward the upper surface of plate part 7a up to a control part or stop surface 7e, with the size being approximately constant beyond the stop surface. Regulating hole 7 opens on the upper surface of the plate part 7a in a square shape which is somewhat larger than the outer shape of contact part 4b. When the protrusions 4e engage the stop surfaces 7e of holes 7d, contact pins 4 then bias regulator 7 upwardly and, as the engaging hooks 7c contact the second stops 2h, the second stopping position of regulator 7 is defined.

As shown in FIGS. 1 through 3, cover 11, formed approximately equal to the outside shape of base 2, is mounted for vertical movement through a compression coil spring 12 at each of four corners. A centrally disposed opening is formed in cover 11 of a suitable size to permit the passage of an IC package 10.

As shown in FIGS. 3 or 4, tiltable link members 14, are attached at one end to shafts 13 at the front and back of cover 11 in the y direction and on both sides in the x direction with shafts 13 serving as fulcrums in cover 11. Different cover positions are depicted in FIG. 4 on opposite sides of the center relative to the width direction (x direction). The other end of link members 14 are interconnected to pivotable latch members 21 by means of operating shafts 15 extending in the y direction and received in elongated generally longitudinal slots 21b formed in the latch members. Each shaft 15 integrally connects a pair of link members in the y direction. In linkage with the up and down movement of cover 11, circular shaped operating part 14a formed at the other end of each link member 14 slides on a curved cam surface 2k formed on the outer sides of the central part 2e of base 2.

As shown in FIG. 4, a latch 21 for depressing IC package 10 is mounted on base 2 on both sides of the center line in the width direction (x direction). Each latch 21 is configured generally in the shape of a lever, with a hook-shaped engagement portion 21a being formed at one end and longitudinal guide hole 21b formed at the other end. A support shaft 22 is received through the middle part of the latch and extends in the depth direction (y direction) of base 2. Latch 21 pivots about shaft 22 and opens and closes in linkage with the action of link members 14 in dependence upon the vertical movement of cover 11 as the operating shaft 15 slides in cam slot 21b. When cover 11 is at its upper position due to the force of compression coil springs 12, engagement portion 21a of each latch 21 is arranged at a position where the IC package 10 on adaptor 5 is depressed.

The through hole of link member 14 that has been provided for receiving shaft 13 is formed somewhat larger than the outer diameter of the shaft with a selected common difference. In the case of the preferred embodiment, a slidable member 16 in the shape of a suitable cylindrical flexible member, for instance, is installed on the shaft. As a result, link members 14 slide without shakiness on the curved cam surface 2k of base 2 with shafts 13 as the center in conformity with the vertical movement of cover 11. Along with this, each latch 21 pivots around shaft 22 toward and away from IC package 10 on seating surface 5c. When an IC package 10 is to be seated, a downward load is applied on cover 11 as shown in FIG. 4 or 5 and latches 21 open as the cover is lowered. As the cover is lowered, adaptor 5 is biased in the z+direction by compression coil springs 6 and engagement hooks 5b are engaged with first stops 2f of base 2 and stopped at the first stopping position.

As the first protrusion parts 4e of contact pins 4 are engaged by respective stop surfaces 7e in regulating hole 7d, regulator 7 is biased upward by the spring force of the elastic portions 4c of contact pins 4. The engagement hooks 7c engage with the second engaging stops 2h of base 2 and the regulator is stopped at the second stopping position. Since the stop surfaces 7e in regulating holes 7d of the regulator 7 function as stops for the upward movement of the contact part 4b of contact pins 4, each first protrusion part 4e is regulated on the same xy plane in regulator 7, that is, at the same height, irrespective of whether the amount of bending of each elastic part 4c varies from one to another.

Figures 8, 8A:
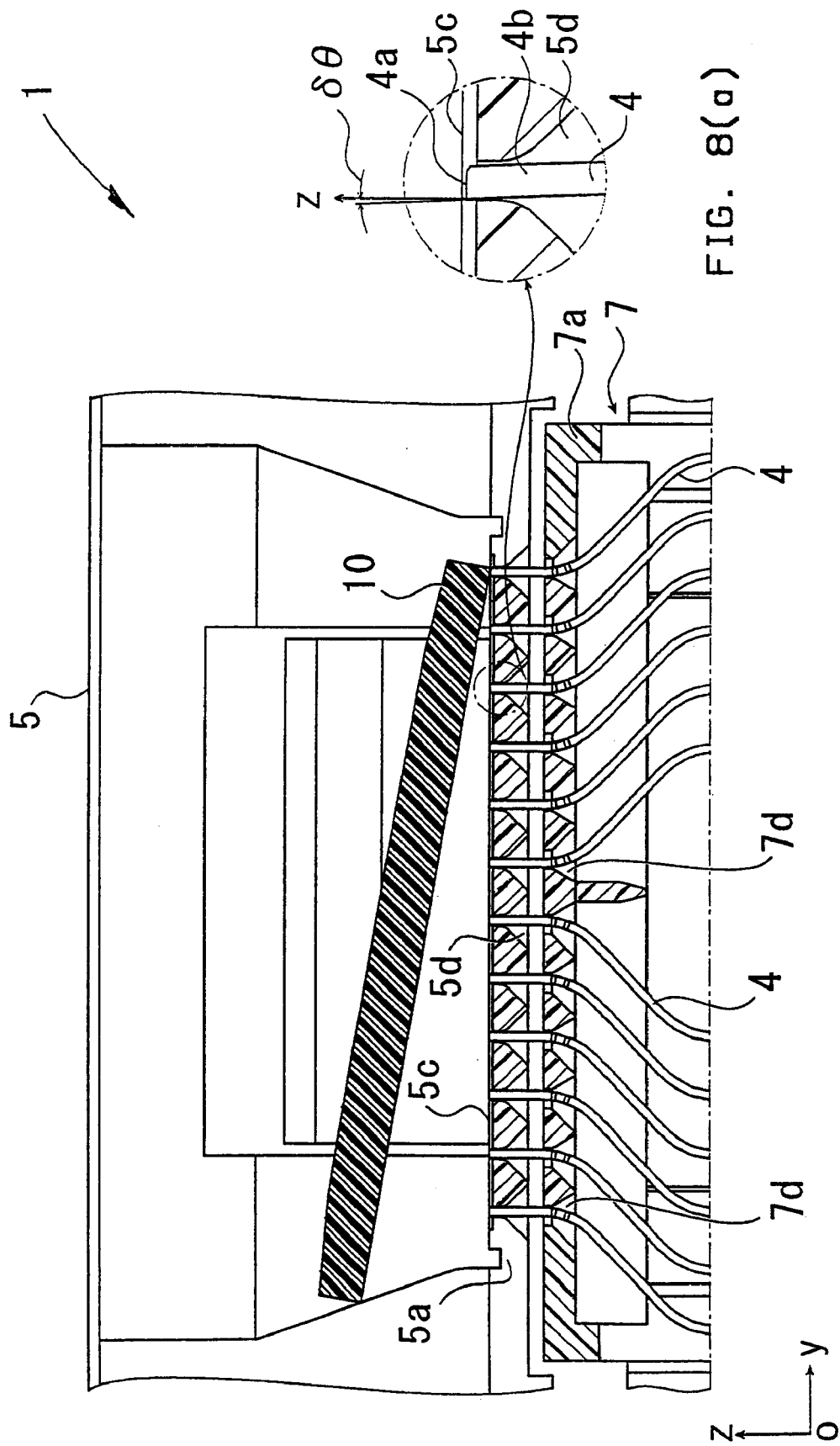
FIG. 8 is a cross section elevational view of the right side of the socket showing an example of an IC package being mounted in a socket made in accordance with the invention.
FIG. 8(a) is an enlarged view of fragment A of FIG. 8.
Figures 10, 10A:
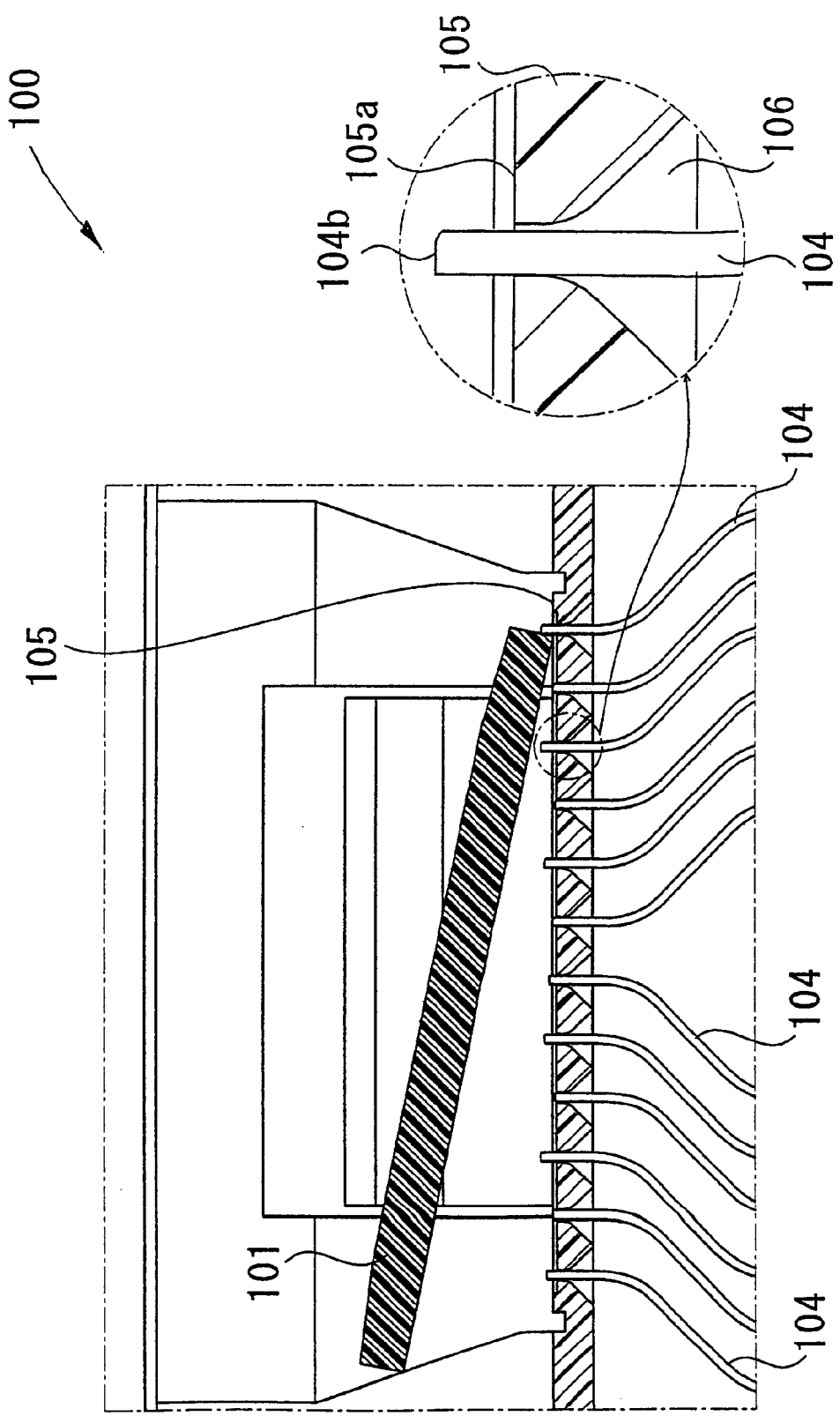
FIG. 10 is a cross sectional view of the right side of a conventional socket showing an example of an IC package being mounted.
FIG. 10(a) is an enlarged view of fragment C of FIG. 10.

The contact tips 4a that have been separated by a prescribed regulation length L1 from respective first protrusion parts 4e do not protrude from above the seating surface 5c but are accommodated inside contact holes 5d. The upper part of holes 7d are formed somewhat larger than the contact part 4b of the contact pins 4 as shown in FIG. 8 and the elastic part 4c of the contact pins are formed so that they are curved to one side. Accordingly, the contact parts 4b tend to be somewhat biased in the contact holes 5d, with a result that the contact parts 4b are arranged with an angle theta of some incline. However, this angle theta is extremely small; the contact parts can be called almost perpendicular.

When cover 11 is raised as the load applied to the cover 11 is removed, latches 21 press IC package 10 and close in such a fashion as to secure it. The latches 21 rotate even after they have engaged IC package 10 and press the IC package and adaptor 5 in opposition to the force of the compression coil springs 6. When contact tips 4a of the contact pins 4 touch respective terminals of IC package 10, adaptor 5 and contact pins 4 are pressed down due to the pivoting motion of latches 21, further bending curved elastic part 4c of the contact pins 4. When contact pins 4 move down, first protrusion portion 4e of the contact pins 4 move down, with a result that regulator 7 moves down under its own weight as the engagement between engagement hooks 7c and second stops 2h of the base 2 is released, with the stop surfaces 7e in the regulating holes 7d and the first protrusion parts 4e of contact pins 4 being engaged.

Because of what has been described above, contact parts 4b have their movement in the x, y directions regulated by the regulating holes 7d of regulator 7, thereby being evenly arranged on the xy plane. As their movement in the z direction is regulated by the stop surface of the regulating holes 7d, the heights of the contact tips 4a are evenly arranged, with a consequence that the elastic parts 4c bend approximately uniformly between the first protrusions 4e and the second protrusions 4f. Accordingly, the contact tips are pressed toward and engage respective terminals of IC package 10 with a uniform force based on approximately the same amount of deformation of the elastic parts 4c. When IC package 10 and adaptor 5 are moved downward by latches 21, the contact parts 4b engage the terminals of IC package 10 with the angle of contact which is somewhat larger than the initial angle theta of incline at the second stopping position.

According to the preferred embodiment described above, contact pins 4 are bent somewhat by regulator 7 at its second stopping position followed by the arrangement of the first protrusion parts 4e on the xy plane in regulator 7. Therefore, it becomes possible to arrange the contact tips 4a that have been separated from the first protrusion parts 4e by regulation length L1 in such a manner that they do not protrude from the seating surface 5c of adaptor 5, with a result that it becomes possible to smoothly place IC package 10 on the seating surface 5c without hooking it by the tip part of a contact pin 4.

Further, according to the preferred embodiment, the first protrusion parts 4e of contact pins 4 are engaged with respective stop surfaces 7e of regulator holes 7d of regulator 7, with regulator 7 being biased upward to the position where it is regulated by the second stops or regulating parts 2h of the base 2 by the spring force of elastic portions 4c of the contact pins. Accordingly, it becomes possible to position the regulator 7 at the second stopping position and, at the same time, arrange the contact tips 4a on the same plane in adaptor 5. Adaptor 5 which seats the IC package is biased upward by the compression coil springs 6, making it possible for the contact pins 4 to bias regulator 7. Accordingly, the load that is added to the contact pins 4 can be minimized, thereby minimizing the fatigue of the contact pins.

The size of the contact holes 5d of adaptor 5 and regulating holes 7d of regulator 7 is chosen to accommodate the contact part 4b of contact pins 4 with some leeway. Therefore, there takes place a change in the direction where the angle of the incline of the contact part 4b becomes somewhat larger along with the lowering of adaptor 5 and regulator 7. Accordingly, the so-called wiping effect is provided whereby the contact tips 4a of contact pins 4 scrape the oxide film that has formed on the terminals of IC package 10, thereby enhancing the electric connection between the contact pins and the terminals of the IC package 10. Because of this, high level connection reliability can be secured.

According to the preferred embodiment, moreover, the upward movement of contact pins 4 which is based on the spring force of the elastic part 4c of contact pins 4 is regulated by the stopping of the first protrusions at the stop surfaces 7e of regulating holes 7d of regulator 7. Therefore, it becomes possible to force the equalization of the distance between the first protrusions 4e and the second protrusions 4f, despite slight variations in the free lengths from a second protrusion to a respective first protrusion of contact pins 4 or in the shape of elastic parts 4c. In terms of ensuring a uniform height of contact tips 4a, it is only necessary to control the dimensional difference regarding the regulation length L1 from first protrusions 4e to contact tips 4a. Because of this, there is an advantage in that the preparation of the contact pins becomes easier.

According to the preferred embodiment, due to the protrusions 4e, the contact pins remain arranged by regulator 7 even when adaptor 5 has been removed, with a result that adaptor 5 can easily be detached and re-attached. This is advantageous in the case where, at the semiconductor manufacturing plant, it becomes necessary to exchange adaptor 5 after mounting socket 1 on a substrate for testing.

The invention can be modified in various ways without being restricted by the specific embodiment described above.

In the preferred embodiment described above, regulator 7 is vertically movable relative to base 2. However, it is possible to make the regulator so that it is vertically movable relative to the adaptor as by providing elongated guide holes having a closed end that extend in a downward direction on the adaptor with the open ends on the bottom of the adaptor and providing guide pins on the regulator receivable in respective guide holes, so that the regulator can be arranged at the second stopping position when the guide pins of the regulating member touches the closed ends of the guide holes of the adaptor.

In the preferred embodiment as described above, furthermore, a socket for mounting LGA packages as the electronic package has been disclosed. However, the socket according to this invention can also be used for BGA packages in which solder balls have been arranged in a selected pitch. In such a case, however, the shape of the contact tip 4a of the contact pins 4 preferably would be modified to have a bifurcated structure so as to ensure an effective electric connection between the solder balls and respective contact pins 4.

In the preferred embodiment described above, the tips of contact pins 4 do not protrude from the seating surface 5c of adaptor 5 when the adaptor is at the first stopping position, its highest position. However, if desired, the tips of contact pins 4 may protrude somewhat from seating surface 5c of adaptor 5 within a limited range where they will not obstruct the mounting of the IC package 10.

In the preferred embodiment described above, when the downward applied force on cover 11 is released subsequent to the placement of IC package 10 on the seating surface 5c of adaptor 5, latches 21 rotate, thereby pressing the IC package as well as adaptor 5 in a downward direction, with a result that, after the tips of contact pins 4 have touched respective terminals of the IC package, the IC package, the adaptor and the contact pin are integrally pressed down and regulator 7 moves downward due to the downward displacement of contact pins 4. However, adaptor 5 and regulator 7 could also be made integrally into one body. In such a case, it would be necessary to cause the tip portions of contacts 4 to protrude from the seating surface of the seating surface within the range where the tip portions will not obstruct the mounting of the IC packages, yet will touch respective terminals of the IC package. As a means for giving an upward bias to this integral adaptor/regulator, it is possible to use the spring force of the contact pins alone or use the spring force of compression coil springs in addition to the spring force of the contact pins.

It is further possible to provide recessed surfaces that correspond to the terminals of the IC package on the seating surface. Here, the terminals of the IC package would be inserted somewhat into the recesses, thereby positioning the area of electrical engagement between the terminals of the IC package and the contact pins below the seating surface.

In addition, if desired, a cam mechanism for causing the vertical movement of adaptor 5 and regulating member 7 in conformity with rotation of the latches 21 can be used.

Thus, according to the invention described above, a socket is provided which is capable of smoothly placing an electronic part without hooking it by the tip of the contact pins on a seating surface.

Although the invention has been described with regard to certain preferred embodiments thereof, further variations and modifications will become apparent to those skilled in the art. It is, therefore, the intention that the appended claims be interpreted as broadly as possible in view of the prior art to include such variations and modifications.

What is claimed:

1. A socket for removably mounting an electronic package having a plurality of terminals comprising:
    a base,
    a plurality of elongated contact elements each having a first mounting end and a second contact end, the first end of each contact element fixedly mounted in the base with the second end extending away from the base and being displaceable toward the base, each contact element having a protrusion disposed a selected distance from the second contact end,
    an adaptor mounted on the base for vertical movement toward and away from the base between a first loading and unloading position and a second operating position closer to the base, the adaptor having a bottom wall formed with a plurality of contact element receiving holes therethrough and having a seating surface for an electronic package,
    a contact element position regulator disposed between the adaptor and the base and being vertically movable between a position having at least a second selected distance from the seating surface when the adaptor is in the first loading and unloading position and a second, lesser distance when the adaptor is in the second operating position, the regulator having a bottom wall formed with a plurality of contact element receiving holes therethrough in alignment with respective holes in the adaptor,
    each contact element having a portion thereof received through a respective hole of the regulator and at least partly through an aligned hole in the adaptor,
    a stop surface formed in each hole of the regulator with upward movement of the contact elements being limited by engagement of the contact element protrusions with respective stop surfaces.

2. A socket according to claim 1 in which the regulator has at least one regulator hook attached thereto and the base has a regulator stop surface, the regulator hook being movable into and out of engagement with the regulator stop surface as the regulator moves vertically to limit upward movement of the regulator.

3. A socket according to claim 1 in which the adaptor has at least one adaptor hook attached thereto and the base has an adaptor stop surface, the adaptor hook being movable into and out of engagement with the adaptor stop surface to limit upward movement of the adaptor.

4. A socket according to claim 2 in which the adaptor has at least one adaptor hook attached thereto and the base has an adaptor stop surface, the adaptor hook being movable into and out of engagement with the adaptor stop surface to limit upward movement of the adaptor.

5. A socket according to claim 1 further including a latch, pivotably mounted on the base and being movable between a first closed position and a second open position, the latch having a force applying portion overlying the adaptor when in the first position and adapted to apply a downward force on an electronic package disposed on the seating surface and move the adaptor downwardly when moving to the first position.

6. A socket according to claim 5 further comprising a vertically movable cover linked to the latch and spring means for biasing the cover upwardly toward the first closed position.

7. A socket according to claim 1 in which the contact elements are formed with an intermediate flexible portion.

8. A socket according to claim 7 in which the contact element receiving holes of the regulator are formed sufficiently large to permit wiping motion of the contact elements.

9. A socket for removably mounting an electronic package having a plurality of terminals comprising a base, a cover mounted on the base for alternating motion in the vertical direction relative to the base, first spring members that bias the cover away from the base, a plurality of contact elements each having a first mounting end secured to the base, a curved intermediate part which can be elastically deformed, and a contact part having a second tip end which is linked to the curved part for being elastically compressed against a terminal of an electronic package, a protrusion formed on the contact elements at a location separated from the tip end by a selected length, a regulator having a plurality of through holes through which the contact part of the contact elements extend, the regulator being movable in an alternating motion in the vertical direction relative to the base, and a plurality of stop surfaces in the through holes of the regulator engageable with respective protrusions for the limitation of the displacement of the contact parts as the stop surfaces engage the protrusions of the contact elements, and a latch pivotably mounted on the base between open and closed positions, an electronic package being insertable when the latch is pivoted from an original closed position to the open position in linkage with a downward motion of the cover, and which presses an electronic package that has been inserted in a downward direction by pivoting from the open position to the original closed position in linkage with the return upward movement of the cover body.

10. A socket according to claim 9 further comprising an adaptor movably mounted above the regulator in such a manner as to be capable of alternating motion in the vertical direction relative to the base and which has a plurality of through holes through which the contact part of the contact elements extend and a seating surface for an electronic package and a second spring member that biases the adaptor upwardly relative to the base, the plurality of contact elements placing a bias on the regulator upwardly relative to the base, the regulator and the adaptor having respective highest positions relative to the base, a selected distance being provided between the adaptor and the regulator when the adaptor and the regulator are at their highest positions respectively and, upon pivoting of the latch to the original closed position, the electronic package and the adaptor are pressed integrally in a downward direction, with the contact part of said contact elements being pressed against respective terminals of the electronic package.

11. A socket as described in claim 10 in which the second end of the contact elements are located below the seating surface when the adaptor is at its highest position.

12. A socket as described in claim 10 in which the second end of the contact elements are situated above the seating surface, thereby maintaining contact with the connective terminal of the electronic part when the latch is in the closed position.

* * * * *